(12) United States Patent
Cho et al.

(10) Patent No.: US 8,232,167 B2
(45) Date of Patent: Jul. 31, 2012

(54) APPLYING EPITAXIAL SILICON IN DISPOSABLE SPACER FLOW

(75) Inventors: Chin-Chen Cho, Boise, ID (US); Er-Xuan Ping, Meridian, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 13/019,540

(22) Filed: Feb. 2, 2011

(65) Prior Publication Data

US 2011/0124171 A1  May 26, 2011

Related U.S. Application Data

(60) Division of application No. 12/014,968, filed on Jan. 16, 2008, now Pat. No. 7,884,427, which is a continuation of application No. 11/305,597, filed on Dec. 16, 2005, now Pat. No. 7,342,273, which is a continuation of application No. 10/861,438, filed on Jun. 3, 2004, now Pat. No. 7,037,775, which is a division of application No. 10/198,924, filed on Jul. 19, 2002, now Pat. No. 6,756,264, which is a division of application No. 09/490,261, filed on Jan. 24, 2000, now Pat. No. 6,448,129.

(51) Int. Cl.
*H01L 21/8234* (2006.01)
(52) U.S. Cl. .................. 438/275; 257/E21.691
(58) Field of Classification Search ............ 438/275; 257/E21.691
See application file for complete search history.

(56) References Cited

U.S. PATENT DOCUMENTS

| | | | |
|---|---|---|---|
| 5,334,861 A | 8/1994 | Pfiester et al. | |
| 5,949,105 A | 9/1999 | Moslehi | |
| 6,037,620 A | 3/2000 | Hoenigschmid et al. | |
| 6,319,783 B1 | 11/2001 | Ang et al. | |
| 6,326,664 B1 | 12/2001 | Chau et al. | |
| 7,037,775 B2 | 5/2006 | Cho et al. | |
| 7,342,273 B2 | 3/2008 | Cho et al. | |
| 7,884,427 B2 * | 2/2011 | Cho et al. | 257/408 |

* cited by examiner

*Primary Examiner* — Mark Prenty
(74) *Attorney, Agent, or Firm* — Lerner, David, Littenberg, Krumholz & Mentlik, LLP

(57) ABSTRACT

A method of fabricating transistors on a semiconductor substrate includes forming transistor gates of first and second transistors located in first and second areas of the semiconductor substrate, respectively. The transistor gates have generally vertical sidewalls. Source and drain regions are simultaneously formed for the first and second transistors. Temporary spacers are formed on the vertical sidewalls of the first and second transistor gates. The temporary spacers of the first transistor abut a semiconductor structure such that the source and drain regions of the first transistor are vertically covered. The temporary spacers of the second transistor cover a portion of the source and drain regions of the second transistor such that a portion of the source and drain regions remain exposed. The semiconductor substrate is exposed to an implant dopant to change the dopant level of the exposed portions of the source and drain regions of the second transistors.

2 Claims, 6 Drawing Sheets

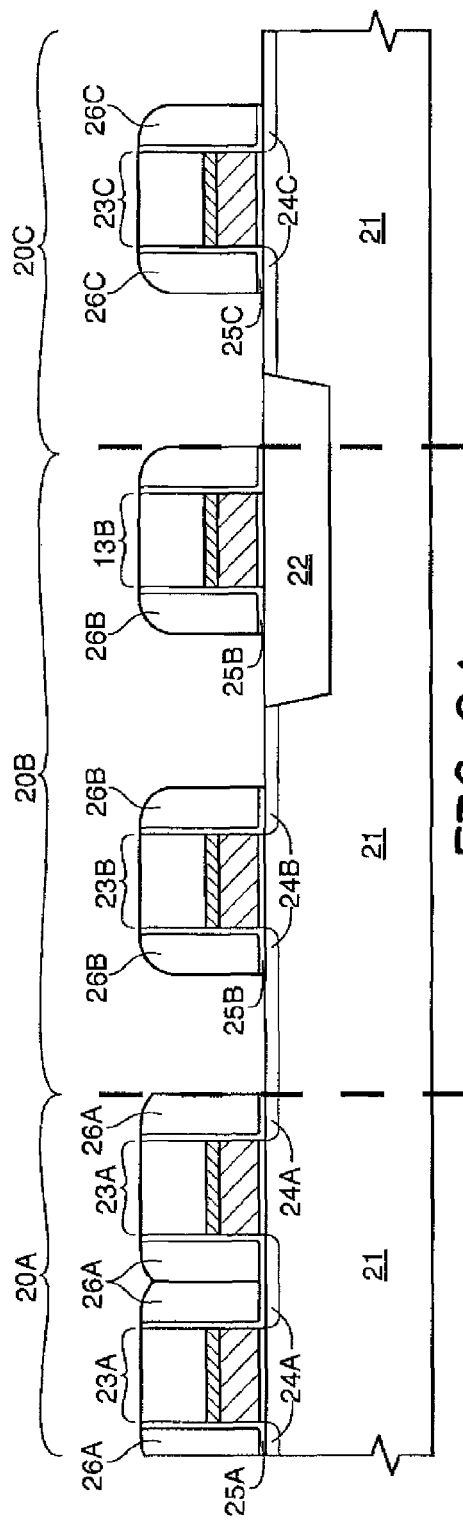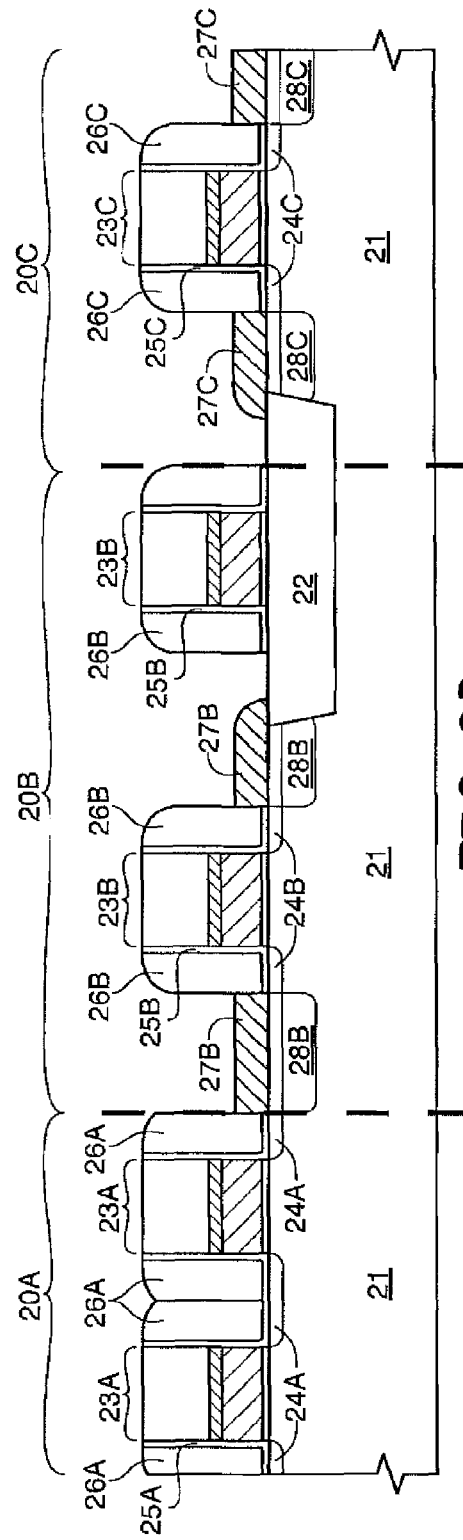

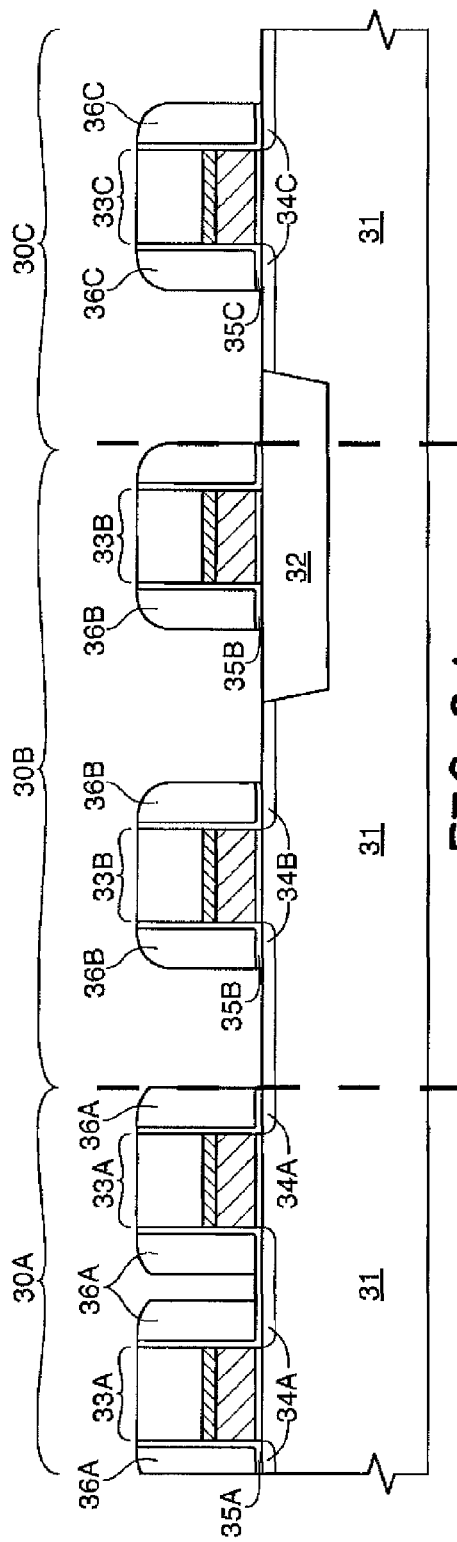
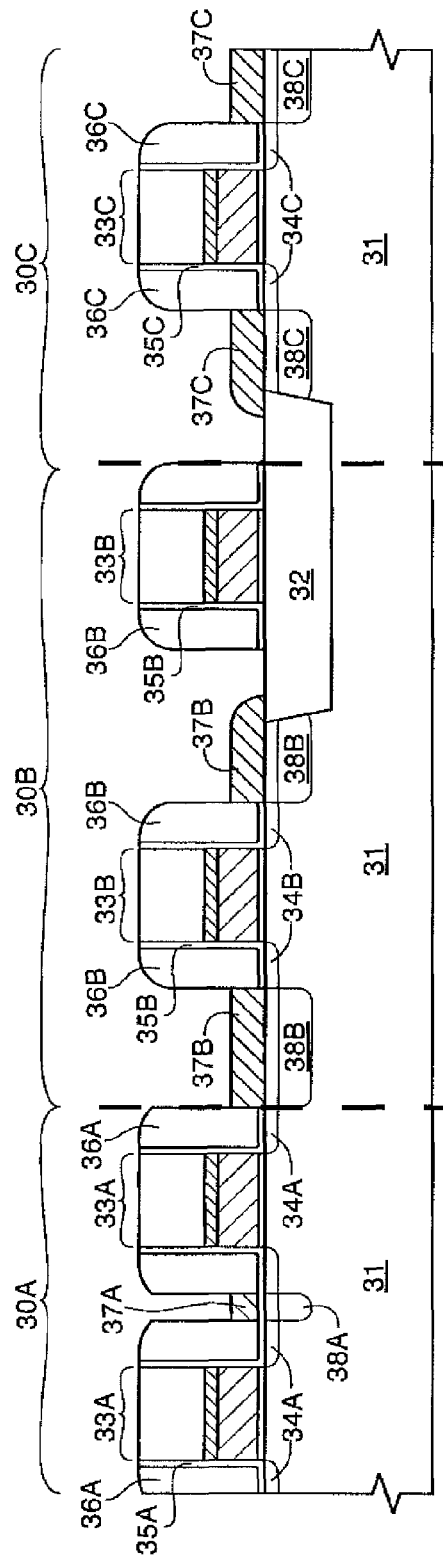

APPLYING EPITAXIAL SILICON IN DISPOSABLE SPACER FLOW

CROSS-REFERENCE TO RELATED APPLICATIONS

This application is a divisional of U.S. patent application Ser. No. 12/014,968, filed Jan. 16, 2008, granted and due to issue on Feb. 8, 2011 as U.S. Pat. No. 7,884,427, which application is a continuation of U.S. patent application Ser. No. 11/305,597, filed Dec. 16, 2005, now U.S. Pat. No. 7,342,273, which application is a continuation of U.S. patent application Ser. No. 10/861,438, filed Jun. 3, 2004, now U.S. Pat. No. 7,037,775, which application is a divisional of U.S. patent application Ser. No. 10/198,924, filed Jul. 19, 2002, now U.S. Pat. No. 6,756,264, which application is a divisional of U.S. patent application Ser. No. 09/490,261, filed Jan. 24, 2000, now U.S. Pat. No. 6,448,129.

FIELD OF THE INVENTION

This invention relates to semiconductor fabrication processing and, more particularly, to a method for forming active devices for semiconductor structures, such as field effect transistors used in random access memories.

BACKGROUND OF THE INVENTION

Conventional fabrication techniques used to form the active transistors in memory devices have led to several undesirable results. It has become common practice to form active transistors with spacers on the vertical walls of the transistor gates by first forming disposable spacers and having the oxide spacers in place during conductive doping implantation steps to form the source/drain regions of the transistors. The disposable oxide spacers are eventually removed and replaced with final spacers that possess a desired spacer thickness.

However, during the final spacer etch, when nitride is used as the spacer material, it is difficult to etch the nitride spacer with high selectivity to silicon and oxide and yet insure that all of the nitride is cleared from the source/drain regions of the active transistors. Because of this difficulty a portion of the field oxide may be removed along with a portion of the silicon substrate that has been implanted with conductive dopants to form the transistor's source/drain regions. Etching into the field oxide can lead to transistor junction current leakage, while etching into the silicon source/drain region can lead to high source/drain resistance or even open circuits. If either of these conditions occurs, they will adversely affect transistor operation.

The present invention discloses a method to form active transistors in a semiconductor memory device that will protect the source/drain region of the active transistors during a spacer etch sequence so as to substantially reduce high source/drain resistance and leakage that may occur in the transistor junction.

BRIEF SUMMARY OF THE INVENTION

Exemplary implementations of the present invention comprise processes for forming active transistors for a semiconductor memory device.

A first exemplary implementation of the present invention utilizes the process steps of forming transistor gates having generally vertical sidewalls in a memory array section and in periphery sections. Conductive dopants are implanted into exposed silicon defined as active area regions of the transistor gates. Disposable (temporary) spacers are formed on the generally vertical sidewalls of the transistor gates. Epitaxial silicon is grown over exposed silicon regions. After the epitaxial silicon is grown, conductive dopants are implanted into the exposed silicon regions to form source/drain regions of the active transistors. The temporary spacers are removed and permanent insulative spacers are formed on the generally vertical sidewalls of the transistor gates.

A second exemplary implementation of the present invention utilizes the process steps listed above, but more specifically, the temporary spacers are formed of oxide and the permanent spacers are formed of nitride.

A third exemplary implementation of the present invention utilizes the process steps of the first exemplary implementation except that the source/drain regions of the active transistor are formed prior to the formation of the epitaxial silicon.

BRIEF DESCRIPTION OF THE DRAWINGS

FIG. 2A is a cross-sectional view depicting a semiconductor substrate after the formation of active transistors in the array and periphery of a semiconductor memory device, including a Light Drain Doping (LDD) implant of both n-channel and p-channel transistors.

FIG. 2B is a cross-sectional view of the structure of FIG. 2A taken after the growth of epitaxial silicon or epitaxial silicon germanium at the exposed diffusion regions of the active transistors, followed by a source/drain doping implant of both n-channel and p-channel transistors.

FIG. 3A is a cross-sectional view depicting a semiconductor substrate after the formation of active transistors in the array and periphery of a semiconductor memory device, including a Light Drain Doping (LDD) implant of both n-channel and p-channel transistors.

FIG. 3B is a cross-sectional view of the structure of FIG. 3A taken after the growth of epitaxial silicon or epitaxial silicon germanium at the exposed diffusion regions of the active transistors, followed by a source/drain doping implant of both n-channel and p-channel transistors.

DETAILED DESCRIPTION

Exemplary implementations of the present invention directed to processes for forming active transistors, in a semiconductor device, are depicted in FIGS. 1A-3C.

Figure 1A:
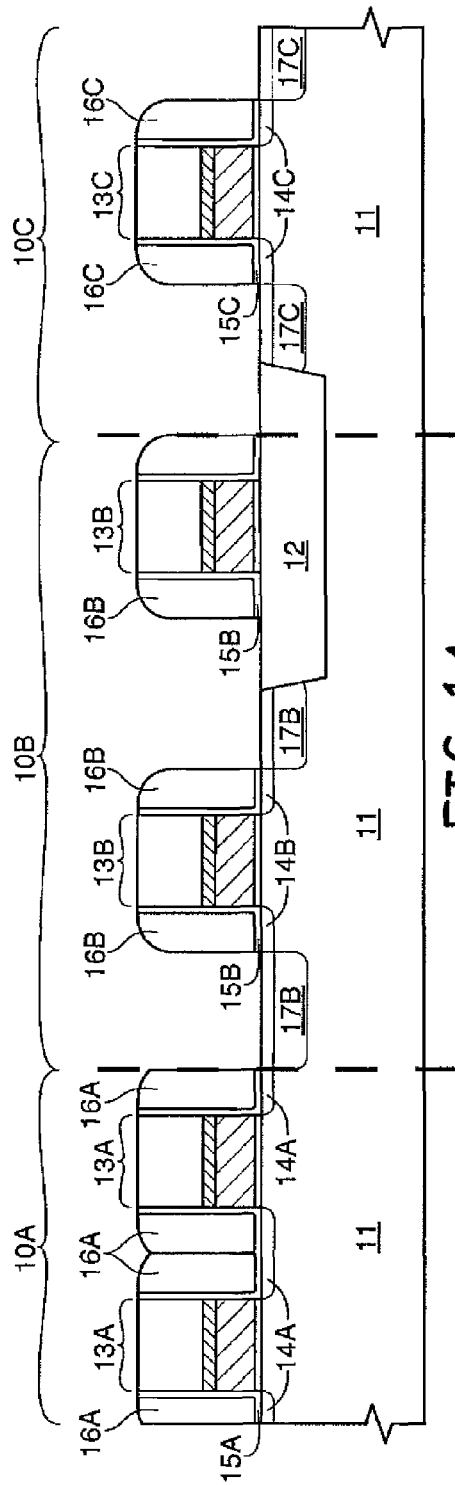
FIG. 1A is a cross-sectional view depicting a semiconductor substrate after the formation of active transistors in the array and periphery of a semiconductor memory device, including a Light Drain Doping (LDD) implant and a source/drain doping implant of both n-channel and p-channel transistors.
Figure 1B:
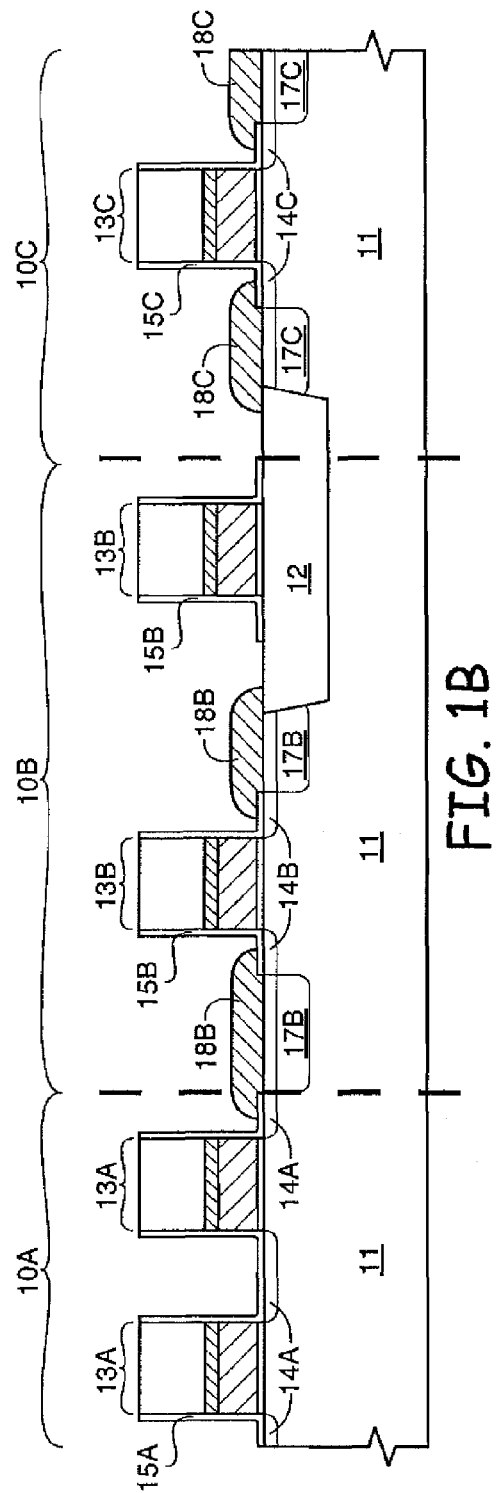
FIG. 1B is a cross-sectional view of the structure of FIG. 1A taken after the removal of the temporary oxide spacers and the growth of epitaxial silicon or epitaxial silicon germanium at the exposed diffusion regions of the active transistors.
Figure 1C:
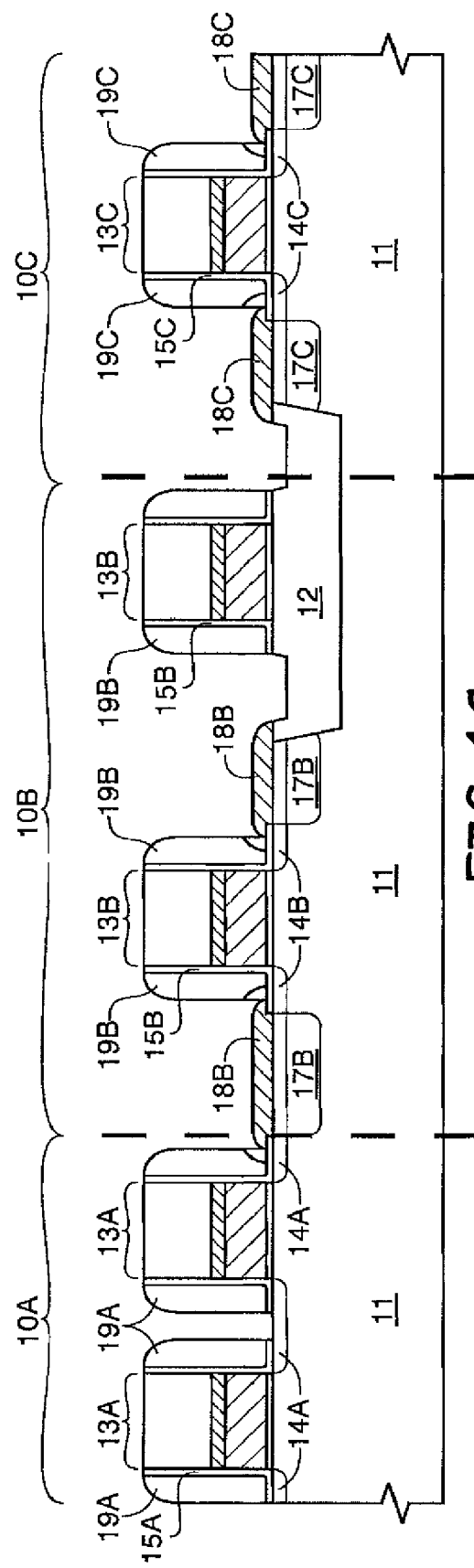
FIG. 1C is a cross-sectional view of the structure of FIG. 1B taken after the formation of silicon nitride spacers along the substantially vertical walls of each transistor gate.

A first exemplary implementation of the present invention is depicted in FIGS. 1A-1C. In the drawings of FIGS. 1A-1C, the semiconductor assembly represents a memory device partitioned into three main sections: memory array section 10A, n-channel periphery section 10B and p-channel periphery section 10C. FIG. 1A depicts a semiconductor assembly 11, such as a silicon wafer, that has been processed to a particular point.

Referring to FIG. 1A, processing steps comprising transistor gate stack deposition, followed by patterning and etching of the gate stack are used to form transistor gates 13A in memory array section 10A, transistor gates 13B in n-channel periphery section 10B, and transistor gates 13C in p-channel periphery section 10C. Following the formation of the transistor gates, lightly doped drain (LDD) n-type regions 14A and 14B, and LDD p-type regions 14C are formed into silicon substrate 11, except where field oxide 12 is present. Next, a nitride layer is deposited over transistor gates 13A, 13B and 13C, over exposed portions of silicon substrate 11 and over field oxide 12. After the deposition of the nitride layer, oxide having a thickness that is greater than one half the width of the spacing between transistor gates 13A (in the memory section 10A), is deposited over the nitride layer. An oxide spacer etch is performed to form temporary oxide spacers 16A, 16B and 16C. Due to the thickness of the oxide layer and to the length of the oxide etch, oxide spacers 16A seal off the underlying silicon between memory transistor gates 13A. The oxide etch will also clear the nitride underlying the oxide and stop once silicon substrate 11 is reached. The oxide etch will also remove the thin nitride layer from the surface of the transistor gates 13B. Since the transistor gate stack typically includes nitride as the top material, each transistor gate remains coated with nitride. The oxide etch also forms nitride liners 15A, 15B and 15C, in memory section 10A, periphery n-channel section 10B, and in periphery p-channel section 10C, respectively. Memory section 10A and n-channel periphery section 10B are masked off and a p-channel source/drain implant is performed to form p-channel source/drain regions 17C. The mask over memory section 10A and n-channel periphery section 10B is stripped and p-channel periphery section 10C is then masked off. Next, an n-channel source/drain implant is performed to form source/drain regions 17B.

Referring now to FIG. 1B, after the n-channel source/drain implant, the mask over p-channel periphery section 10C is stripped and an oxide wet etch is performed to remove temporary oxide spacers 16A, 16B, and 16C shown in FIG. 1A. Using the exposed portions of silicon substrate 11, at source/drain regions 17B and 17C, an epitaxial silicon or silicon germanium material is grown to form epitaxial extension regions 18B and 18C. At epitaxial extension regions 18B and 18C, the epitaxial material will not only grow upward, but outward as well, resulting in a portion of epitaxial material to grow beyond the boundaries of the exposed silicon surface.

Referring now to FIG. 1C, a nitride layer is deposited over the semiconductor assembly using conventional nitride deposition techniques. Next, a nitride spacer etch is performed to form permanent nitride spacers 19A, 19B and 19C. During the nitride spacer etch, epitaxial material 18B and 18C is reduced according to the length of time the nitride etch is performed. During the nitride spacer etch, it is critical that the nitride is removed from the surface of the epitaxial material and yet sufficient nitride material remains to seal off the surface of silicon substrate 11 at the base of nitride spacers 19A, 19B and 19C.

For example, if the space between transistor gates 13A, in memory array section 10a, is 0.2 microns, a 0.12 microns thick temporary spacer (16A) can be deposited to fill the space. A wet etch can be used to remove 0.04 microns of the temporary spacer so that the final spacer thickness of temporary spacers 16B and 16C is 0.08 microns. After the source/drain implant and a second wet etch is performed to remove the disposable oxide (spacers 16A, 16B and 16C), an epitaxial material (18B and 18C) is grown to a thickness of 0.06 microns. Following epitaxial material growth, the nitride layer used to form nitride spacers 19A, 19B and 19C is deposited to a thickness of 0.04 microns. Next, by using a nonselective etch, the epitaxial material and the nitride material are removed at the same rate. To ensure the 0.04 micron thick nitride overlying the epitaxial material is completely removed, a 50% over etch is used that will not only remove the 0.04 microns nitride layer, but also remove 0.02 microns of the epitaxial material. This etch will result in the formation of nitride spacer thickness of 0.04 microns and an epitaxial material thickness of 0.04 microns, which guarantees the that the silicon surface of source/drain diffusion regions 17B and 17C will not be etched.

Thus, the epitaxial material protecting the source/drain diffusion regions 17B and 17C from the above mentioned nitride spacer etch helps to prevent high source/drain resistance that can occur when a portion of the silicon containing the source/drain region is removed. The presence of the epitaxial material also allows for the formation of shallow transistor junctions. Another function of the epitaxial material is to protect the field oxide 12 during the nitride spacer etch to prevent transistor junction leakage (current) that can result. The process flow of the present invention improves transistor isolation and provides a process flow that that is highly scalable for geometrically smaller devices. The semiconductor device is then completed in accordance with fabrication processes known to those skilled in the art.

Figure 2C:
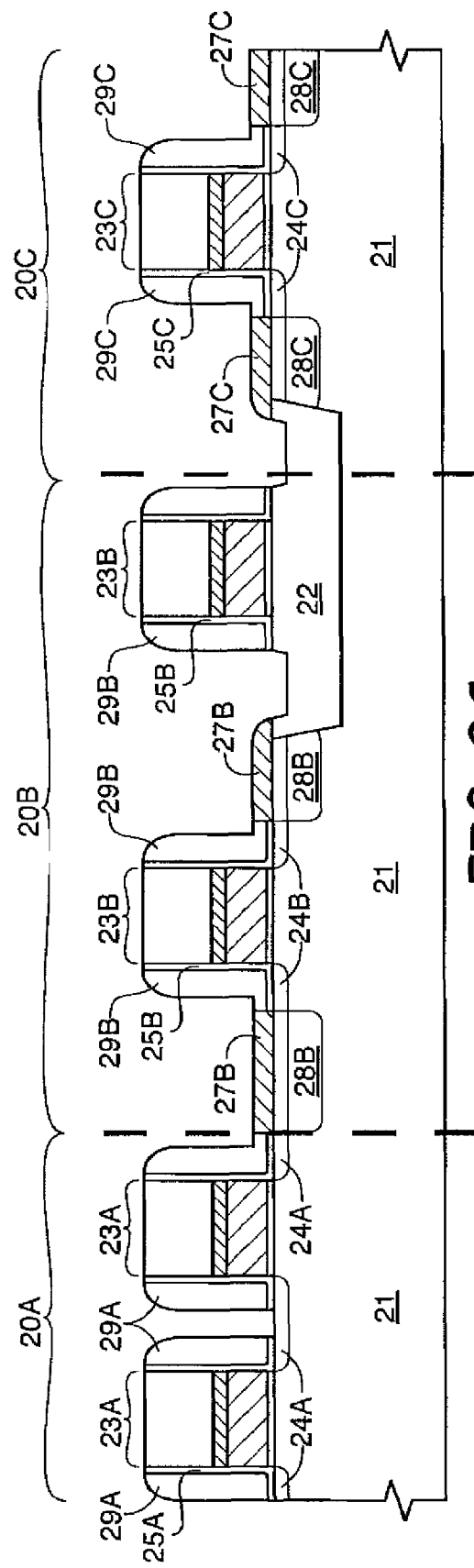
FIG. 2C is a cross-sectional view of the structure of FIG. 2B taken after the removal of temporary oxide spacers and the formation of permanent silicon nitride spacers along the substantially vertical walls of each transistor gate.

A second exemplary implementation of the present invention is depicted in FIGS. 2A-2C. In the drawings of FIGS. 2A-2C, the semiconductor assembly represents a memory device partitioned into three main sections: memory array section 20A, n-channel periphery section 20B and p-channel periphery section 20C. As in the first exemplary implementation, FIG. 2A depicts a semiconductor assembly 21, such as a silicon wafer, that has been processed to a particular point.

Referring to FIG. 2A, processing steps described in the first exemplary implementation are used to form transistor gates 23A in memory array section 20A, transistor gates 23B in n-channel periphery section 20B, and transistor gates 23C in p-channel periphery section 20C. Following the formation of the transistor gates, lightly doped drain (LDD) n-type regions 24A and 24B, and LDD p-type regions 24C are formed into silicon substrate 11, except where field oxide 22 is present. Next, a nitride layer is deposited over transistor gates 23A, 23B and 23C, over exposed portions of silicon substrate 21 and over field oxide 22. After deposition of the nitride layer, oxide having a thickness that is greater than one half the width of the spacing between transistor gates 23A (in the memory section 20A), is deposited over the nitride layer. An oxide spacer etch is performed to form temporary oxide spacers 26A, 26B, and 26C. Due to the thickness of the oxide layer and to the length of the oxide etch, oxide spacers 26A seal off the underlying silicon between memory transistor gates 23A. The oxide etch will also clear the nitride underlying the oxide and stop once silicon substrate 21 is reached. The oxide etch also forms nitride liners 25A, 25B and 25C, in memory section 20A, periphery re-channel section 20B, and in periphery p-channel section 20C.

Referring now to FIG. 2B, using the exposed portions of silicon substrate 21, an epitaxial silicon or silicon germanium material is grown to form epitaxial extension regions 27B and 27C. At epitaxial extension regions 27B and 27C, the epitaxial material will not only grow upward, but outward as well, resulting in a portion of epitaxial material to grow beyond the boundaries of the exposed silicon surface. Memory section 20A and n-channel periphery section 20B are masked off and a p-channel source/drain implant is performed to form p-channel source/drain regions 28C, which include epitaxial extension regions 27C. The mask over memory section 20A and n-channel periphery section 20B is stripped and p-channel periphery section 20C is then masked off. Next, an n-channel source/drain implant is performed to form source/drain regions 28B, which includes epitaxial extension regions 27B. The presence of epitaxial extension regions 27B and 27C, become important as is discussed later in the process.

Referring to FIG. 2C, after the n-channel source/drain implant, the mask over p-channel periphery section 20C is stripped and an oxide wet etch is performed to remove temporary oxide spacers 26A, 26B, and 26C, shown in FIG. 2B. Following the oxide etch, a nitride layer is deposited over the semiconductor assembly using conventional nitride deposition techniques and a nitride spacer etch is performed to form permanent nitride spacers 29A, 29B and 29C. During the nitride spacer etch, epitaxial material 27B and 27C is reduced according to the length of time the nitride etch is performed. The ideal etch is timed so that the entire nitride material is removed from the surface of the epitaxial material and yet none of the silicon from the silicon surface (i.e., silicon substrate 21) of source/drain diffusion regions 28B and 28C is removed. The epitaxial material protecting the source/drain diffusion regions 28B and 28C from the above mentioned nitride spacer etch helps to prevent high source/drain resistance that can occur when a portion of the silicon containing the source/drain region is removed. The presence of the epitaxial material also allows for the formation of shallow transistor junctions. Another function of the epitaxial material is to protect the field oxide 22 during the nitride spacer etch to prevent transistor junction leakage (current) that can result. The process flow of the present invention improves transistor isolation and provides a process flow that that is highly scalable for geometrically smaller devices. The semiconductor device is then completed in accordance with fabrication processes known to those skilled in the art.

Figure 3C:
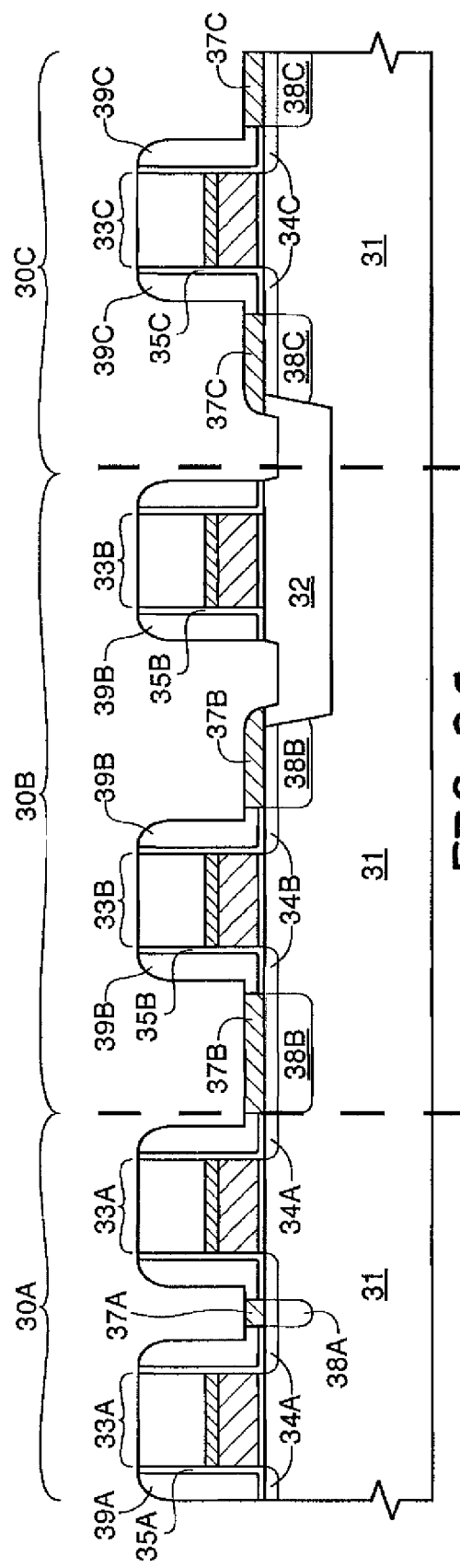
FIG. 3C is a cross-sectional view of the structure of FIG. 3B taken after the removal of temporary oxide spacers and the formation of permanent silicon nitride spacers along the substantially vertical walls of each transistor gate.

A third exemplary implementation of the present invention is depicted in FIGS. 3A-3C. In the drawings of FIGS. 3A-3C, the semiconductor assembly represents a memory device partitioned into three main sections: memory array section 30A, n-channel periphery section 30B and p-channel periphery section 30C. As in the second exemplary implementation, FIG. 3A depicts a semiconductor assembly 31, such as a silicon wafer, that has been processed to a particular point. The processing steps of the second exemplary implementation are used to develop memory section 30A, n-channel periphery section 30B and p-channel periphery section 30C. However, there is a variation in the development of these sections and in particular with memory section 30A, which is described later. As shown in FIGS. 3A-3C, field oxide 32 is formed in silicon substrate 31, transistor gates 33A, 33B and 33C, vertically surrounded by oxide spacers 36A, 36B and 36C, are formed on top of silicon substrate 31, and diffusion regions, including lightly doped regions 34A, 34B and 34C, epitaxial extension regions 37A, 37B and 37C and source/drain regions 38A, 38B and 38C, are formed as well.

As mentioned above, a variation in the process changes the resulting semiconductor assembly. Instead of depositing oxide to the thickness described in the second exemplary implementation of the present invention, the oxide layer used to form oxide spacers 36A, 36B and 36C is deposited to a thickness that is less than one half the width of the spacing between transistor gates 33A (in the memory section 30A). Once the oxide spacer etch is performed, oxide spacers 36A will have a gap between them that will allow the formation of epitaxial region 37A, shown in FIG. 3B.

Referring to FIG. 3C, a nitride layer is deposited over the semiconductor assembly using conventional nitride deposition techniques. A nitride spacer etch is performed to form permanent nitride spacers 39A, 39B and 39C, which are present on the vertical edges of epitaxial growth 38A, 38B and 38C, as well as on the vertical walls of transistor gates 33A, 33B and 33C. During the nitride spacer etch, epitaxial material 37A, 37B and 37C is reduced according to the length of time the nitride etch is performed. The ideal etch is timed so that nitride material is removed from the surface of the entire epitaxial material and yet none of the silicon from the silicon surface (i.e., silicon substrate 31) of source/drain diffusion regions 38A, 38B and 38C is removed. The semiconductor device is then completed in accordance with fabrication processes known to those skilled in the art.

In the above exemplary implementations of the present invention, desired conditions to form an epitaxial silicon material comprise presenting a gas flow of 5 slm of hydrogen ($H_2$), 50 sccm of dichlorosilane (DCS) and 15 sccm of hydrochloric acid (HCl) to the surface of silicon assembly 11, with the processing chamber temperature at 825° C. and the pressure set at 133 Pa. Desired conditions to form an epitaxial silicon germanium material comprise presenting a gas flow of 5 slm of $H_2$, 100 sccm of DCS, 20 sccm of $GeH_4$ (10% $H_2$) and 20 sccm of HCl to the surface of silicon assembly 11, with the processing chamber temperature at 750° C. and the pressure set at 400 Pa.

It is to be understood that although the present invention has been described with reference to several preferred embodiments, various modifications, known to those skilled in the art, may be made to the process steps presented herein without departing from the invention as recited in the several claims appended hereto.

The invention claimed is:

1. A method of fabricating transistors on a semiconductor substrate comprising:
    forming transistor gates of first and second transistors located in first and second areas of the semiconductor substrate, respectively, wherein the transistor gates have generally vertical sidewalls;
    simultaneously forming source and drain regions for the first and second transistors;
    forming temporary spacers on the vertical sidewalls of the first and second transistor gates, wherein the temporary spacers of the first transistor abut a semiconductor structure such that the source and drain regions of the first transistor are vertically covered, and wherein the temporary spacers of the second transistor cover a portion of the source and drain regions of the second transistor such that a portion of the source and drain regions remain exposed; and
    exposing the semiconductor substrate to an implant dopant to change the dopant level of the exposed portions of the source and drain regions of the second transistors.

2. The method of claim 1, further comprising:
    forming epitaxial regions above the exposed portions of the source and drain regions of the second transistors.

* * * * *